United States Patent [19]

Sakiyama et al.

[11] Patent Number: 5,153,148
[45] Date of Patent: Oct. 6, 1992

[54] METHOD OF FABRICATING SEMICONDUCTOR LASERS

[75] Inventors: Hajime Sakiyama, Kyoto; Haruo Tanaka, Shiga; Masato Mushiage, Kyoto, all of Japan

[73] Assignee: Rohm Co., Ltd., Kyoto, Japan

[21] Appl. No.: 605,095

[22] Filed: Oct. 30, 1990

Related U.S. Application Data

[62] Division of Ser. No. 469,248, Jan. 24, 1990, Pat. No. 4,999,841.

[30] Foreign Application Priority Data

Jan. 24, 1989 [JP] Japan ................................. 1-14345
Jan. 24, 1989 [JP] Japan ................................. 1-14348

[51] Int. Cl.⁵ .................. H01L 21/203; H01L 21/225
[52] U.S. Cl. ...................................... 437/129; 437/90; 437/107; 437/133; 437/247; 437/173; 437/936; 148/DIG. 71; 148/DIG. 94; 148/DIG. 95
[58] Field of Search ............... 148/DIG. 50, DIG. 51, 148/DIG. 56, DIG. 65, DIG. 71, DIG. 72, DIG. 90, DIG. 94, DIG. 95, DIG. 109, 33, 33.2, 33.3, 33.4; 357/16, 17; 372/46, 48; 437/81, 89, 90, 105, 107, 126, 133, 173, 247, 935, 936, 942, 129, 247

[56] References Cited

U.S. PATENT DOCUMENTS

| | | | |
|---|---|---|---|
| 4,567,060 | 1/1986 | Hayakawa et al. | 372/46 |
| 4,937,835 | 6/1990 | Omura | 437/129 |
| 4,962,057 | 10/1990 | Epler et al. | 437/173 |
| 4,980,314 | 12/1990 | Strege | 437/129 |
| 4,987,097 | 1/1991 | Nitta et al. | 437/129 |
| 4,999,841 | 3/1991 | Sakiyama et al. | 372/46 |
| 5,028,562 | 7/1991 | Shima | 437/129 |
| 5,045,500 | 9/1991 | Mitsui et al. | 437/129 |

FOREIGN PATENT DOCUMENTS

| | | | |
|---|---|---|---|
| 0227179 | 12/1984 | Japan | 437/129 |
| 0244023 | 10/1986 | Japan | 372/44 |

OTHER PUBLICATIONS

Tanaka et al., ". . . (AlGa)As Double-Heterostructure Lasers Fabricated by Molecular Bean Epitoxy," Jpn. J. Appl. Phys., vol. 24, No. 2 Feb. 1985, pp. L89-90.
Warren et al., "Masked, Anisotropic Thermal Etching and Regrowth for in situ Patterning . . . ," Appl. Phys. Lett., 51(22), Nov. 30, 1987, pp. 1898-1920.

Primary Examiner—Mary Wilczewski
Attorney, Agent, or Firm—Wenderoth, Lind & Ponack

[57] ABSTRACT

The invention is directed to a semiconductor laser wherein the first embodiment is characterized in that the first upper portion cladding layer is assumed to be a double layer construction, the upper layer portion is assumed to be higher in carrier concentration than the lower layer portion, the series resistance component is restrained, so that the sequential direction voltage $V_F$ may be lowered without damaging the other characteristics such as oscillation start current I th and so on.

2 Claims, 4 Drawing Sheets

METHOD OF FABRICATING SEMICONDUCTOR LASERS

This is a divisional of Ser. No. 07/469,248 filed Jan. 24, 1990, now U.S. Pat. No. 4,999,841.

BACKGROUND OF THE INVENTION

The present invention relates to a semiconductor laser having a multi-layered for lowering the forward voltage, and, more particularly, to a GaAs laser semiconductor enabled by molecular beam epitaxy method, and a method therefore.

Conventionally, what is shown in FIG. 8 is known as a semiconductor laser designated by reference numeral 21, which has a lower portion cladding layer 23 composed of N type $Al_xGa_{1-x}$, As, an active layer 24 composed of $Al_x$, $Ga_{1-x}As$. As, a first upper portion cladding layer 25 composed of P type $Al_xGa_{1-x}As$, a light absorption layer 26 composed of N type GaAs, and an evaporation preventing layer 27 composed of N type $Al_x$, $Ga_{1-x}$, As are laminated on, for example, N type of GaAs type substrate 22. These respective layers 23 through 27 are formed by the use conventional apparatus in a known manner.

A stripe groove 29 is formed by means of photo etching from the evaporation preventing layer 27 to the light absorption layer 26. Furthermore, a second upper portion cladding layer 30 composed of P type $Al_yG_{1-x}As$ and a cap layer 31 composed of P+ type GaAs are laminated to form as a regrowth enabled by means of conventional method. The first upper portion cladding layer 25 and the second upper portion cladding layer 30 come into contact against each other by the stripe groove 29. Electrodes 32a, 32b are formed respectively on the substrate 22 and the cap layer 31.

In the above-described conventional semiconductor laser 21, in the regrowth boundary A, i.e., the boundary between the first upper portion cladding layer 25 and the second upper portion cladding layer 30, a boundary level is formed. Thus, there is a problem that the series resistance component is increased and the forward voltage $V_F$ becomes higher.

Besides, as a method of manufacturing GaAs semiconductor lasers, for instance, the following processes i through iv are adapted in a known manner.

i: A first growth process, wherein a lower portion cladding layer, an active layer, a first upper portion cladding layer, a light absorption layer and an evaporation preventing layer are laminated on the surface of a GaAs substrate introduced into the growth chamber of a conventional apparatus for use in molecular beam epitaxy method.

ii: An etching process, wherein the laminated GaAs substrate is taken out of the growth chamber, and a stripe deep enough to reach down to the light absorption layer.

iii: A reevaporation process, wherein the GaAs substrate with the stripe groove being formed is heated to selectively evaporate the light absorption layer.

iv: A second growth process, wherein the second upper portion cladding layer and a cap layer are laminated on the GaAs substrate with the impurities being evaporated.

In the above-described conventional method for manufacturing GaAs semiconductor lasers, although the first upper portion cladding layer comes into contact with the second upper portion cladding layer in the stripe groove, there is a problem that the boundary order of the both is caused in the boundary, i.e., the current contraction portion and the forward voltage $V_F$ becomes higher.

It appeared that this problem could be solved by the increase in the carrier concentration of the first upper portion cladding layer. However, when the carrier concentration of the first upper portion cladding layer is increased, there is a problem that the other characteristics such as threshold current I th and so on are reduced.

SUMMARY OF THE INVENTION

Accordingly, the present invention has been developed to substantially eliminate the above discussed drawbacks inherent in the prior art semiconductor laser and method therefore.

The essential object of the present invention is to provide a multi-layer semiconductor laser having a property lower in the forward voltage $V_F$ without damaging the other characteristics thereof.

Another object of the present invention is to provide the semiconductor laser of GaAs type lower in the forward voltage $V_F$ on the employment of molecular beam epitaxy method (MBE method).

A further object of the present invention is to provide a method of manufacturing the semiconductor laser of inner-stripe construction having a property lower in the forward voltage $V_F$. In accomplishing these and other objects, according to one preferred embodiment of the present invention, there is provided a semiconductor laser having a multi-layered construction, wherein a lower portion cladding layer, an active layer, a first upper portion cladding layer, a light absorption layer, an evaporation preventing layer are sequentially laminated on the semiconductor substrate, a stripe groove reaching the first upper portion cladding layer from the evaporation preventing layer is formed, a second upper portion cladding layer and a cap layer are formed so as to cover the stripe groove, the electrodes are respectively formed on the semiconductor substrate and the cap layer, the semiconductor laser characterized in that the first upper portion cladding layer is constructed with a two-layer construction in a manner that the upper layer portion is higher in carrier concentration than the lower layer portion. Thus, since the carrier concentration near the regrowth boundary A is higher, the series resistance portion may be reduced, the forward voltage $V_F$ may be lowered. Also, since the carrier concentration is higher in the first upper portion cladding layer in the upper layer portion only, the danger of damaging the other characteristics such as oscillation start current I th, and so on is restricted.

Also, in order to solve the above described problem of the prior art, according to another preferred embodiment of the present invention, there is provided a method of manufacturing the semiconductor laser comprising a first growth process, wherein a lower portion cladding layer, an active layer, a first upper portion cladding layer, a light absorption layer, and an evaporation preventing layer are laminated on the surface of a semiconductor substrate introduced into the growth chamber of an apparatus for use in molecular beam epitaxy process, an etching process, wherein the laminated semiconductor substrate is taken out of the growth chamber, and a stripe groove deep enough to reach down to the light absorption layer, a reevaporation process, wherein the semiconductor substrate with the stripe groove being formed is introduced into the growth chamber of the apparatus of molecular beam epitaxy process to heat the semiconductor substrate so as to selectively evaporate the light absorption layer, a second growth process, wherein the second upper portion cladding layer and a cap layer are laminated on the semiconductor substrate with the impurities being evaporated, and characterized in that in the second growth process, the carrier concentration of the second upper portion cladding layer is made higher than the carrier concentration of the first upper portion cladding layer so as to be grown, after the growth of the second upper portion cladding layer, the semiconductor substrate is heated for the given time within the growth chamber of an apparatus for molecular beam epitaxy which is suitable for the mass production of GaAs semiconductor lasers, before the cap layer growth.

In the method of manufacturing the semiconductor laser of the present invention, since the carrier concentration of the second upper portion cladding layer is made higher, dopant is diffused from the second upper portion cladding layer to the first upper portion cladding layer when the heating is effected for a given time. Therefore, the carrier concentration is increased only in the boundary portion of the first upper portion cladding layer, the series resistance component is reduced to lower the forward voltage $V_F$. But since the carrier concentration is increased in the first upper portion cladding layer on the boundary portion only, the danger of damaging the other characteristics such as oscillation start current I th and so on is reduced.

In addition to molecular beam epitaxy method, the present invention is also applied to Metal-organics Chemical Vapor Deposition method (MOCVD), Chemical Beam Epitaxy method (CBE), Metal-organic Molecular Beam Epitaxy method (MOMBE) and the likes.

BRIEF DESCRIPTION OF THE DRAWINGS

These and other objects and features of the present invention will become clear from the following description taken in conjunction with the preferred embodiments thereof with reference to the accompanying drawings, in which.

DETAILED DESCRIPTION OF THE INVENTION

Figure 1:
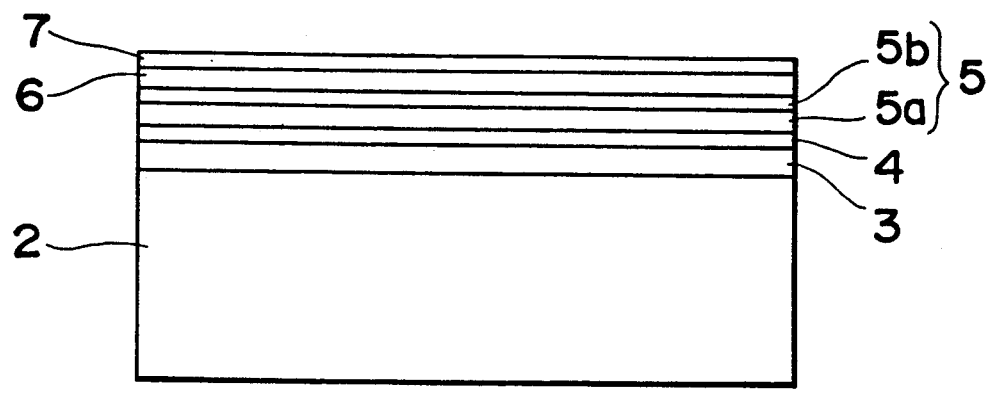
FIGS. 1 to 3 are respectively cross-sectional views for illustrating a manufacturing process of a semiconductor laser of one type in accordance with a first embodiment of the present invention.

Before the description of the present invention proceeds, it is to be noted that like parts are designated by like reference numerals throughout the accompanying drawings.

FIRST EMBODIMENT

A first embodiment of the present invention will be described hereinafter with reference to FIG. 1 to FIG. 3.

FIG. 1 is a view for illustrating a semiconductor laser in the first embodiment of this invention, which comprises multi-layers including substrate 2, lower portion cladding layer 3, active layer 4, first upper portion cladding layer 5 with a lower layer portion 5a and an upper layer portion 5b, light absorption layer 6, evaporation preventing layer 7, stripe groove 9, second upper portion cladding layer 10, cap layer 11, and electrodes 12a and 12b.

Figure 2:
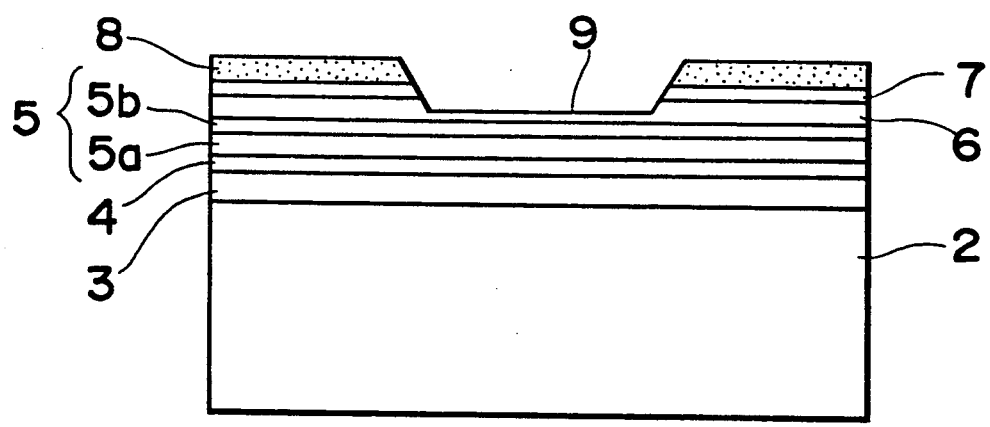
Figure 3:
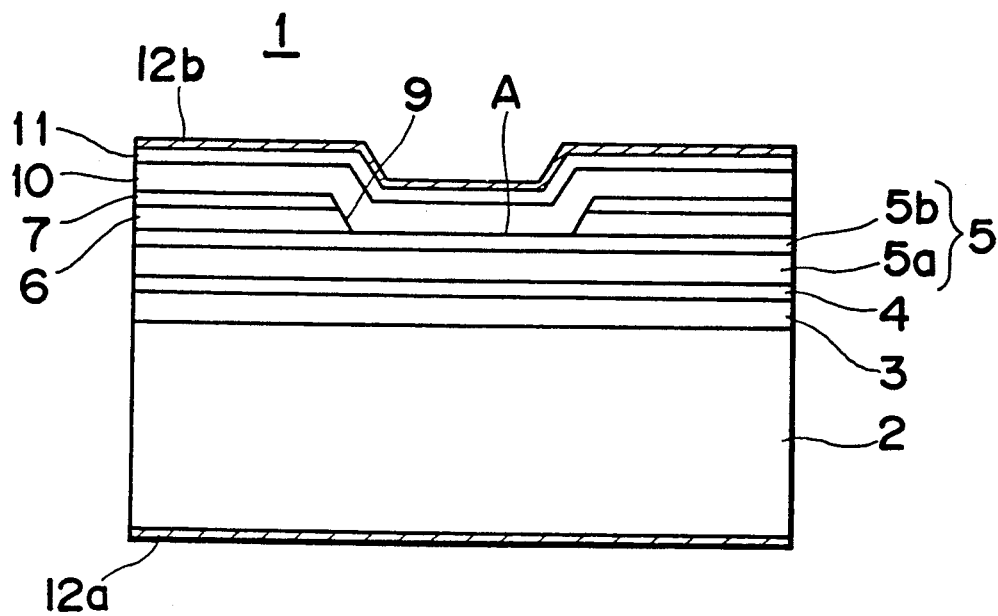
Figure 8:
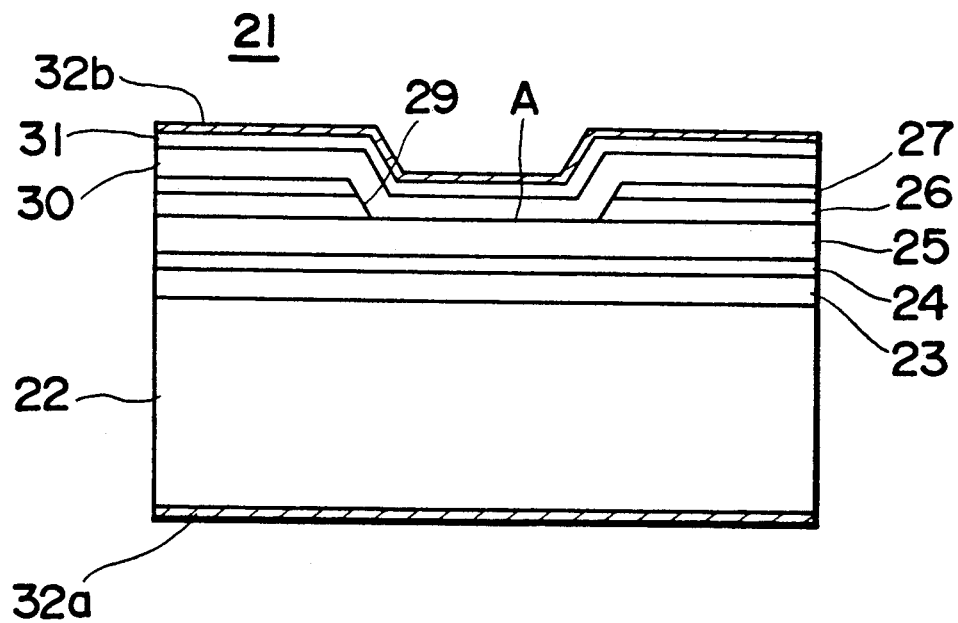
FIG. 8 is a cross-sectional view showing a conventional semiconductor laser as already described above.

FIGS. 2 and 3 are respectively illustrating views of a manufacturing process of the semiconductor laser 1. When the illustration is effected following the manufacturing process, first the N type GaAs substrate 2 is prepared, is engaged with a molybdenum stand of an apparatus for use in molecular beam epitaxy process (not shown), and is heated. Within the apparatus, raw materials and impurities, that is, dopant put into the evaporation source are evaporated in the shape of molecular beams. The shutter of the evaporation source is controlled, and the respective layers 3 through 7 given hereinafter are formed. Namely, the lower portion cladding layer 3 composed of N type $Al_xGa_{1-x}As$ (X=0.6), an active layer 4 composed of $Al_xGa_{1-x}As$ (X=0.15), a first upper portion cladding layer 5, a light absorption layer 6 composed of the N type GaAs, the evaporation preventing layer 7 composed of N type $Al_xGa_{1-x}As$ (X=0.15) are laminated in order, as shown in FIG. 1. The first upper portion cladding layer 5 is of a double layer construction of an upper layer 5b, a lower layer 5a, the lower layer 5a is P type of $Al_xGa_{1-x}As$ (X=0.6), the upper layer 5b is assumed to be P+ type of $Al_xGa_{1-x}As$ (X=0.6), the upper layer 5b is assumed to be higher in the carrier concentration than the lower layer 5a. It is to be noted that the value of the Al composition X is not restricted to the above-described value, but is property variable.

Then, the substrate 2 is taken out of the apparatus, the portion except for the portion where the stripe groove 9 is formed on the evaporation preventing layer 7 is covered with a photo resist 8, as shown in FIG. 1. With the photoresist 8 as a mask, the evaporation preventing layer 7, the light absorption layer 6 are respectively etched selectively to form the stripe groove 9. At this time, the light absorption layer 6 slightly remains.

Continuously, the photoresist 8 is removed from the substrate 2, the substrate 2 is engaged with the apparatus again, is heated at the temperatures of about 650° through 800°, preferably approximately 760° C., with the As molecular beams being applied upon it. The light absorption layer 6 left at this process is evaporated, and the first upper portion cladding layer upper layer portion 5b is exposed within the stripe groove 9.

After the completion of the reevaporation, the second upper portion cladding layer 10 composed of P type $Al_yGa_{1-y}As$ is formed so as to cover the stripe groove 9. The value of the Y is assumed to be, for example, 0.6. Furthermore, a cap layer 11 composed of P+ type GaAs is formed on the second upper portion cladding layer 10. Finally, the electrodes 12a, 12b are respectively formed on the reverse face of the substrate 2 and the cap layer 11 surface to complete the semiconductor laser 1 (see FIG. 1).

As the P+ type of first upper portion cladding layer upper layer portion 5b higher in the carrier concentration is positioned on the regrowth interface A lower side in the semiconductor laser 1, the series resistance component becomes lower. Therefore, the sequential direction voltage $V_F$ may be restrained lower, for instance, less than 2 V. Also, since the carrier concentration of the first upper portion cladding layer whole is not high, the other characteristics such as the threshold current I th and so on are not damaged, either.

SECOND EMBODIMENT

A second embodiment of the present invention will be described with reference to FIG. 4 to FIG. 7, wherein the reference numerals are same as those of the first embodiment except for a boundary portion 5c of the first upper portion cladding layer 5.

FIGS. 4 to 7 are views for illustrating the processes of manufacturing a semiconductor laser in accordance with the second embodiment of the present invention, which comprises the following four processes a to d.

a. First growth process

Figure 4:
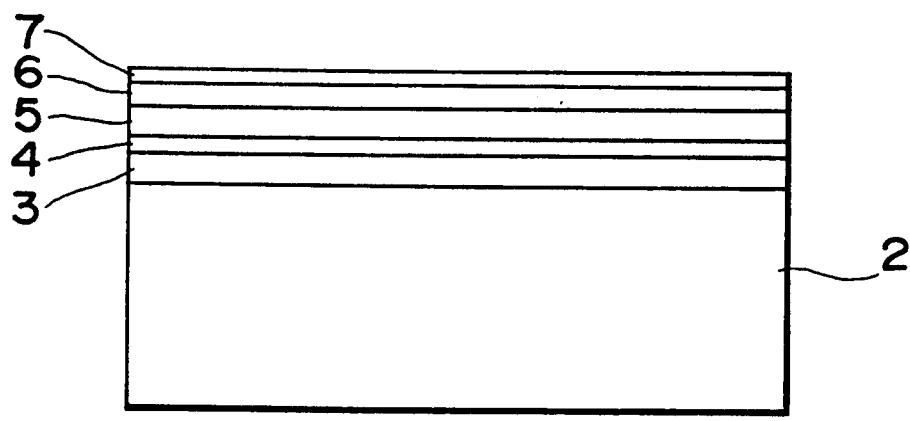
FIGS. 4 to 7 are respectively cross-sectional views for illustrating a manufacturing process of a semiconductor laser of another type in accordance with a second embodiment of the present invention.

First, the N type GaAs substrate 2 engaged with a molybdenum block is introduced into a growth chamber of an apparatus for use in molecular beam epitaxy process. Within the apparatus growth chamber, raw materials and impurities, that is dopant put into the evaporation source are evaporated in the shape of molecular beams. The shutter of the evaporation source is restrained, and the respective layers 3 through 7 given hereinafter are sequentially grown, as shown in FIG. 4.

Namely, a lower portion cladding layer 3 composed of N type of $Al_xGa_{1-x}As$ (X=0.6), an active layer 4 composed of $Al_xGa_{1-x}As$ (X=0.15), a first upper portion cladding layer 5 composed of P type $Al_xGa_{1-x}As$ (X=0.6), a light absorption layer 6 composed of the N type GaAs, an evaporation preventing layer 7 composed of N type $Al_xGa_{1-x}As$ (X=0.15) are laminated in order. It is to be noted that the value of the Al composition X shown hereinabove is one example, is properly variable.

b. Etching process

Figure 5:
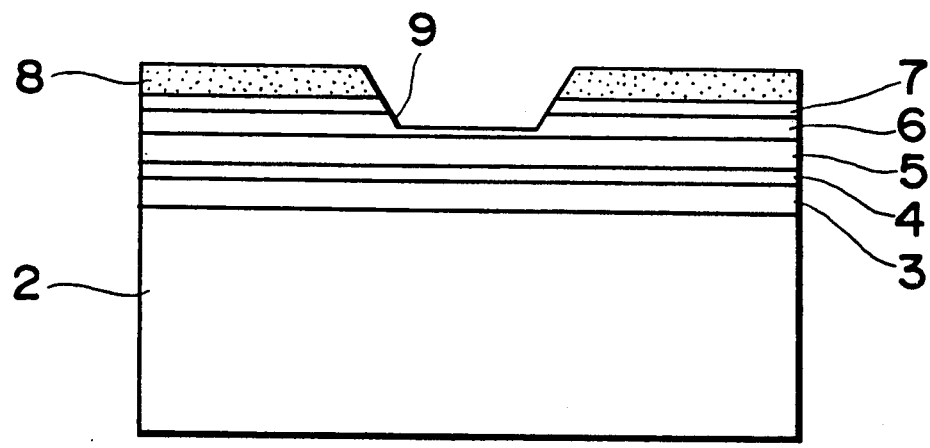

The laminated GaAs substrate 2 is taken out externally from within the apparatus growth chamber, thereafter the evaporation preventing layer 7 except for the portion with the stripe groove to be formed in it is covered with a photoresist 8, as shown in FIG. 5. And the evaporation preventing layer 7 and the light absorption layer 6 are respectively etched to form the stripe groove 9 so that the light absorption layer 6 may be slightly left, for example, approximately 1000 A.

c. Reevaporation process

After the photoresist 8 has been removed, the GaAs substrate 2 is introduced again into the apparatus growth chamber to heat the GaAs substrate 2 at a temperature of approximately 650° C. through 850° C. with the As molecular beams being applied upon it. The impurities attached onto the GaAs substrate are evaporated during this period, also the remaining light absorption layer 6 is also evaporated to expose the first upper portion cladding layer 5 onto the stripe groove 9 bottom portion.

d. Second growth process

Figure 6:
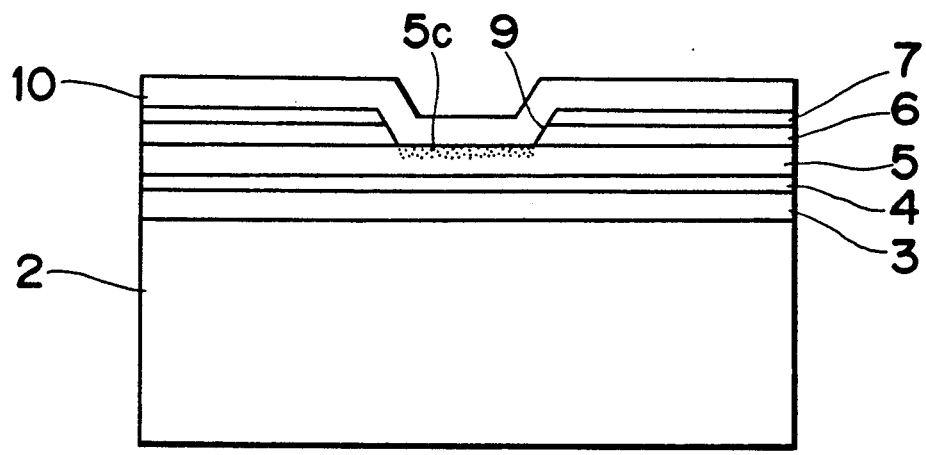

Then, the second upper cladding layer 10 is grown on the GaAs substrate 2, as shown in FIG. 6. The second upper portion cladding layer 10 is composed of P+ type of $Al_yGa_{1-y}As$, for example, Al component Y=0.6, with the carrier concentration being higher by one unit than the first upper portion cladding layer 5. For example, if the carrier concentration of the first upper portion cladding layer 5 is $3 \times 10^{17}$ cm$^{-3}$, the carrier concentration of the second upper portion cladding layer is assumed to be approximately $3 \times 10^{18}$ cm$^{-3}$.

When the growth of the second upper portion cladding layer 10 is finished, the temperature of the GaAs substrate 2 is raised again up to 650° C. through 850° C., preferably approximately 760° C., and is retained as it is for several minutes through several tens of minutes (anneal), for instance, about 20 minutes. During this period, the dopant is diffused from the second upper portion cladding layer 10 to the first upper portion cladding layer 5 to increase the carrier concentration of the upper portion cladding layer boundary portion 5c, for instance, to the extent of value about $8 \times 17^{17}$ to $1 \times 10^{18}$ cm$^{-3}$.

Figure 7:
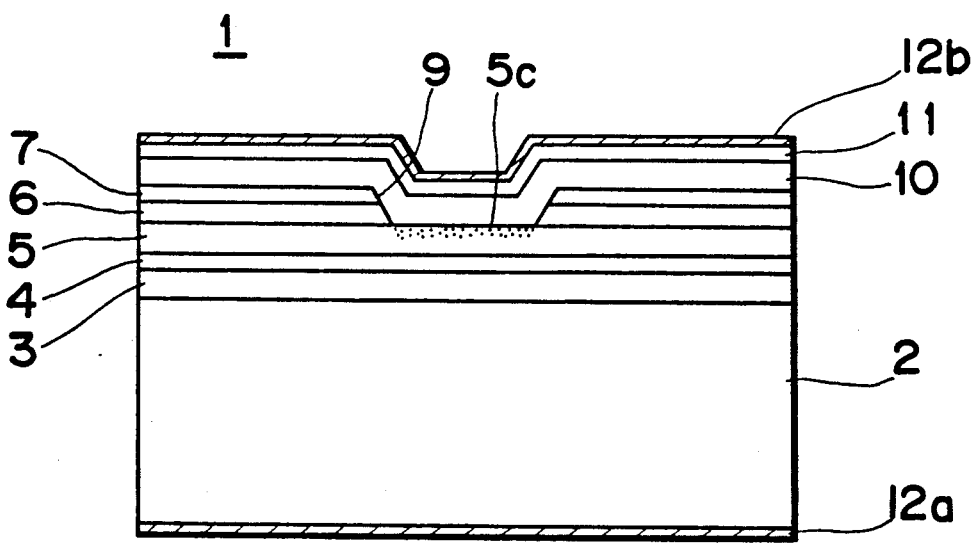

After the annealing operation has been completed, the cap layer 11 composed of the P+ type of GaAs is grown on the second upper portion cladding layer 10 to form the electrodes 12a, 12b likewise as described conventionally, as shown in FIG. 7.

Since the semiconductor laser 1 provided thus is made higher in the carrier concentration of the first upper portion cladding layer boundary portion 5c, the series resistance component may be restrained, and the forward voltage $V_F$ is lowered. On one hand, since the carrier concentration of a portion except for the boundary portion 5c of the first upper portion cladding layer 5 remains as it was conventionally, the other characteristics such as oscillation start current I th, and so on are not damaged. Also, there is an advantage in that the diffusion of the dopant from the second upper portion cladding layer to the first upper portion cladding layer may be effected within the apparatus growth chamber.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. In a method for manufacturing semiconductor lasers which comprises:
    a. a first growth process, wherein a lower portion cladding layer, an active layer, a first upper portion carrier containing cladding layer, a light absorption layer and an evaporation preventing layer are laminated on the surface of a semiconductor substrate introduced into the growth chamber of an apparatus,
    b. an etching process, wherein the laminated semiconductor substrate is taken out of the growth chamber, and a strip groove deep enough to reach down to the light absorption layer is formed,
    c. a reevaporation process, wherein the semiconductor substrate with the stripe groove being formed is introduced into the growth chamber of the apparatus to heat the semiconductor substrate so as to selectively evaporate the light absorption layer, and
    d. a second growth process, wherein a second upper portion cladding layer and a cap layer are laminated on the semiconductor substrate after the light absorption layer is evaporated,
    the improvement wherein in the first growth process, the first upper portion cladding layer is constructed with a two-layer construction of which the upper portion is higher in carrier concentration than the lower portion, said upper portion and lower portion being of the same conductivity type.

2. In a method for manufacturing semiconductor lasers which comprises:

a. a first growth process, wherein a lower portion cladding layer, an active layer, a first upper portion carrier containing cladding layer, a light absorption layer and an evaporation preventing layer are laminated on the surface of a semiconductor substrate introduced into the growth chamber of an apparatus, b. an etching process, wherein the laminated semiconductor substrate is taken out of the growth chamber, and a stripe groove deep enough to reach down to the light absorption layer is formed, c. a reevaporation process, wherein the semiconductor substrate with the stripe groove being formed is introduced into the growth chamber of the apparatus to heat the semiconductor substrate so as to selectively evaporate the light absorption layer, and d. a second growth process, wherein a second upper portion carrier containing cladding layer and a cap layer are laminated on the semiconductor substrate after the light absorption layer is evaporated, the improvement wherein:

in the second growth process the carrier concentration of the second upper portion cladding layer is made higher than the carrier concentration of the first upper portion cladding layer, and the semiconductor substrate is heated for a given time in the growth chamber within the apparatus before the cap layer growth, said first and second upper portion cladding layers being of the same conductivity type.

* * * * *